(12) United States Patent
Juengling

(10) Patent No.: US 8,557,656 B2
(45) Date of Patent: Oct. 15, 2013

(54) CROSS-HAIR CELL BASED FLOATING BODY DEVICE

(75) Inventor: Werner Juengling, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/584,590

(22) Filed: Aug. 13, 2012

(65) Prior Publication Data
US 2012/0309149 A1 Dec. 6, 2012

Related U.S. Application Data

(62) Division of application No. 12/702,123, filed on Feb. 8, 2010, now Pat. No. 8,278,703.

(51) Int. Cl.
*H01L 21/8242* (2006.01)

(52) U.S. Cl.
USPC ........... 438/242; 438/238; 438/246; 438/270; 438/272; 438/275; 257/E21.422

(58) Field of Classification Search
None
See application file for complete search history.

(56) References Cited

U.S. PATENT DOCUMENTS

2007/0235785 A1* 10/2007 Kahng et al. .......... 257/297

* cited by examiner

*Primary Examiner* — Kyoung Lee
(74) *Attorney, Agent, or Firm* — Fletcher Yoder

(57) ABSTRACT

A non-planar transistor having floating body structures and methods for fabricating the same are disclosed. In certain embodiments, the transistor includes a fin having upper and lower doped regions. The upper doped regions may form a source and drain separated by a shallow trench formed in the fin. During formation of the fin, a hollow region may be formed underneath the shallow trench, isolating the source and drain. An oxide may be formed in the hollow region to form a floating body structure, wherein the source and drain are isolated from each other and the substrate formed below the fin. In some embodiments, independently bias gates may be formed adjacent to walls of the fin. In other embodiments, electrically coupled gates may be formed adjacent to the walls of the fin.

20 Claims, 6 Drawing Sheets

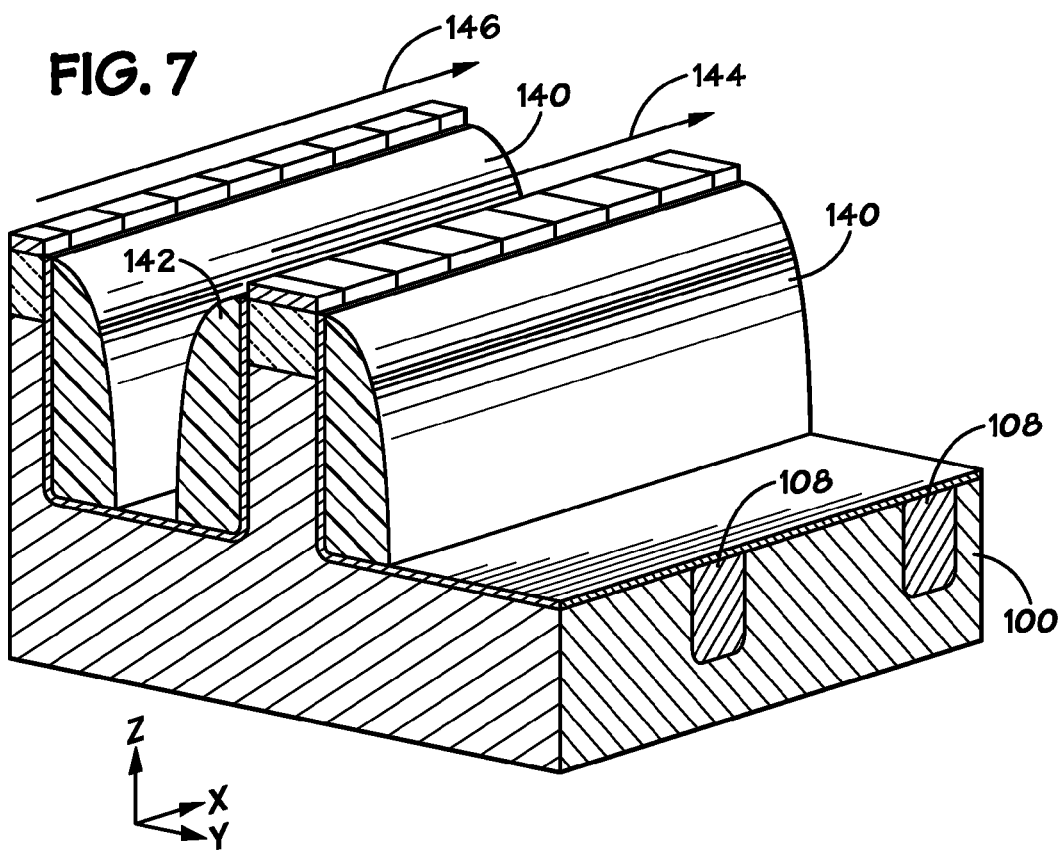
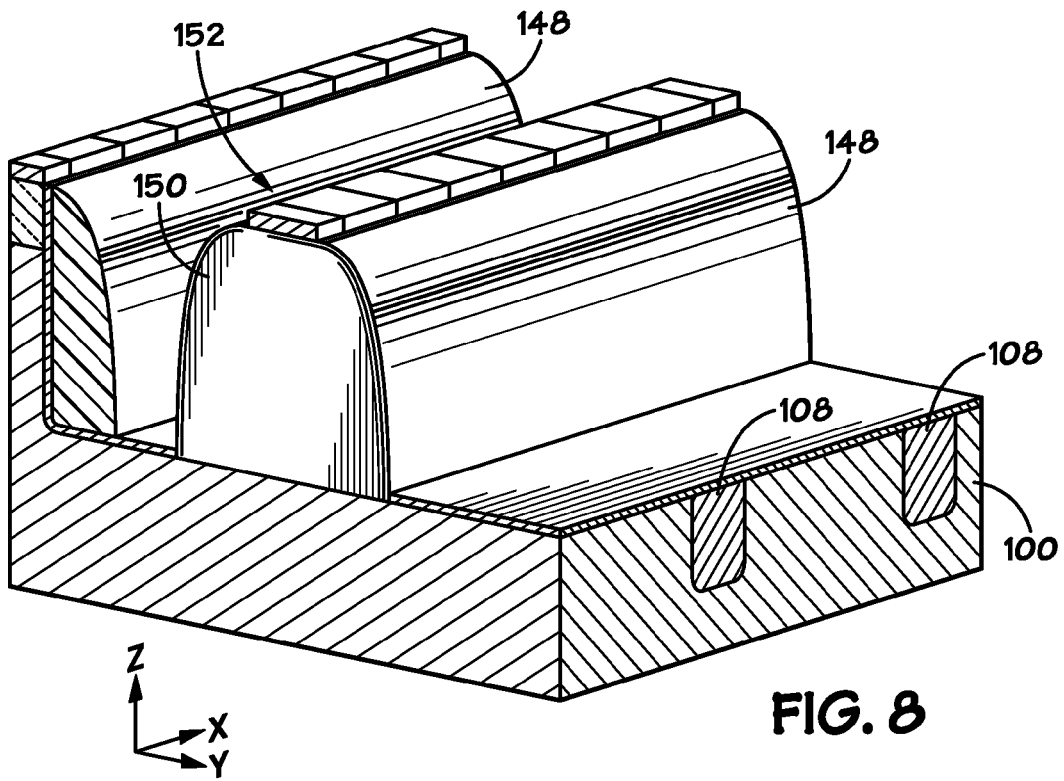

CROSS-HAIR CELL BASED FLOATING BODY DEVICE

CROSS-REFERENCE TO RELATED APPLICATION

This application is a divisional of U.S. patent application Ser. No. 12/702,123, which was filed on Feb. 8, 2010.

BACKGROUND

1. Field of Invention

The invention relates generally to electronic devices, and, more specifically, to non-planar transistors and techniques for fabricating the same.

2. Description of Related Art

Fin field effect transistors (finFETs) are often built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively energizing the gate.

High aspect ratio fins typically are desirable but challenging to construct. Generally, high aspect ratio finFETS can be integrated into a small area of the substrate, thereby potentially reducing manufacturing costs on a per-transistor basis. To increase density of the transistors, the width of each fin, and the gap between each fin, may be reduced. As the dimensions of the fin structures and the space between each fin are reduced, construction of gates or other structures of the fins may be increasingly difficult.

BRIEF DESCRIPTION OF DRAWINGS

FIG. 7 depicts formation of independently biased gates in accordance with an embodiment of the present invention;

FIG. 8 depicts formation of electrically coupled gates in accordance with an embodiment of the present invention.

DETAILED DESCRIPTION

Some of the subsequently discussed embodiments may facilitate the manufacture of high aspect ratio structures, such as finFETs. As is described in detail below, during manufacture of the finFET, a hollow region may be formed during etch of the sidewalls of the fins. An oxide or other suitable material may be formed in the hollow region to isolate portions of the transistor from a substrate. The resulting structures may form a floating body cell in the body of the fin. The following discussion describes devices and process flows in accordance with embodiments of the present technique. Prior to addressing these embodiments from the device and process flow perspective, systems in accordance with embodiments of the present technique are described.

Figure 1:
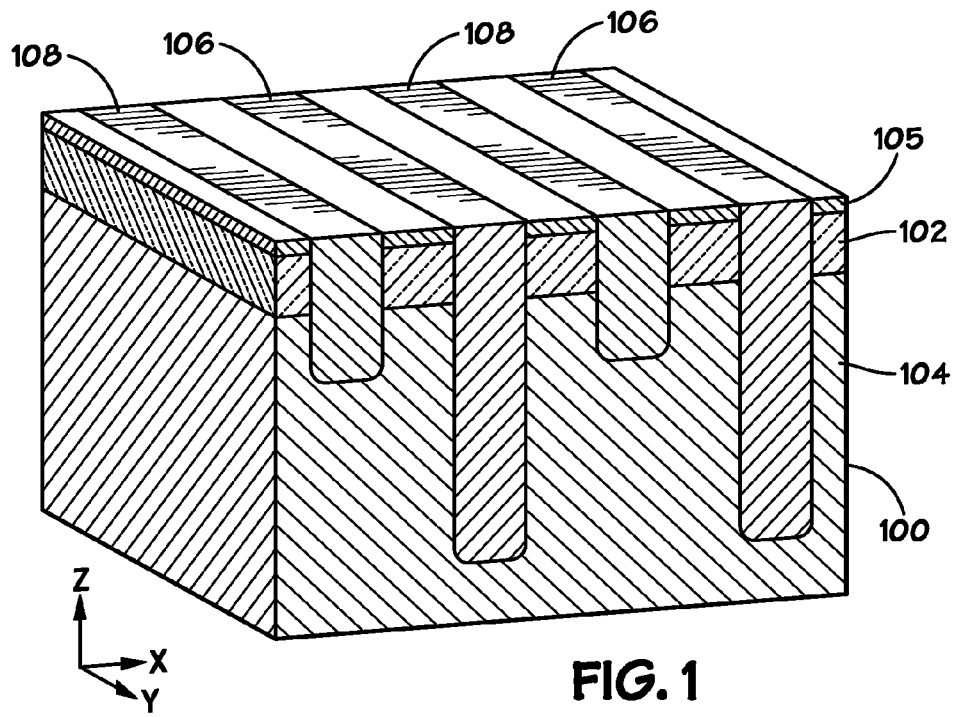
FIG. 1 depicts a substrate having features formed during a manufacturing process in accordance with an embodiment of the present invention.

FIG. 1 depicts a substrate 100 having features formed during a manufacturing process in accordance with an embodiment of the present invention. It should be appreciated that the features described below in FIG. 1 may be formed by any suitable processes and techniques to form a substrate suitable for processing to form the floating body cells described in further detail below.

With reference to FIG. 1, in one embodiment the manufacturing process may begin with providing a substrate 100. The substrate 100 may include semiconductive materials such as single crystalline or poly crystalline silicon, gallium arsenide, indium phosphide, or other materials with semiconductor properties. Alternately, or additionally, the substrate 100 may include a non-semiconductor surface on which an electronic device may be constructed such as a plastic or ceramic work surface, for example. The substrate 100 may be in the form of a whole wafer, a portion of a diced wafer, or a portion of a diced wafer in a packaged electronic device, for instance.

Additionally, the substrate 100 may include an upper doped region 102 and a lower doped region 104 formed in the substrate 100 by any suitable processes. The upper doped region 102 and the lower doped region 104 may be differently doped. For example, the upper doped region 102 may be an n+ material and the lower doped region 104 may be a p– material (referred to as a "p-well"). The depth of the upper doped region 102 may be generally uniform over a substantial portion of the substrate 100, such as throughout a substantial portion of an array area of a memory device, for example. The upper doped region 102 and lower doped region 104 may be formed by implanting or diffusing dopant materials. Alternatively, or additionally, one or both of these layers 102 and/or 104 may be doped during growth or deposition of all or part of the substrate 100, such as during epitaxial deposition of a semiconductive material or during growth of a semiconductive ingot from which wafers may be cut. As is explained below, the upper doped region 102 may form a source and a drain of a transistor, and the lower doped region 104 may form a channel of a transistor.

One or more layers 105 may be disposed on a surface of the substrate 100. For example, such layers may include a pad oxide, a stop body, a sacrificial body, and may include such materials as oxides, nitrides, and/or polysilicon. The layer 105 may be used in or may be a remnant of processing of the substrate 100, such as by atomic layer deposition (ALD), chemical vapor deposition (CVD), planarization, etc.

Deep isolation trenches 106 and shallow trenches 108 may be formed in the substrate 100. These trenches 106 and 108 may generally extend in the y-direction, as indicated in FIG. 1. One or more shallow trenches 108 may be interposed between pairs of the deep isolation trenches 106. In some embodiments, the shallow trenches 108 may be deeper than the upper doped region 102 to separate subsequently formed sources and drains. Additionally, the deep isolation trenches 106 may be deeper than the shallow trenches 108 to isolate subsequently formed transistors. The deep isolation trenches 106 and/or shallow trenches 108 may have a generally rectangular or trapezoidal cross-section, and, in some embodiments, their cross-section may be generally uniform through some distance in the x-direction. The deep isolation trenches 106 and shallow trenches 108 may be partially or entirely filled with one or more dielectric materials, such as high density plasma (HDP) oxide, for instance, to electrically isolate features. Additionally, the deep isolation trenches 106 and/or shallow trenches 108 may include one or more liner materials, such as silicon nitride for example, to relieve film stresses, improve adhesion, and/or function as a barrier material.

Figure 2:
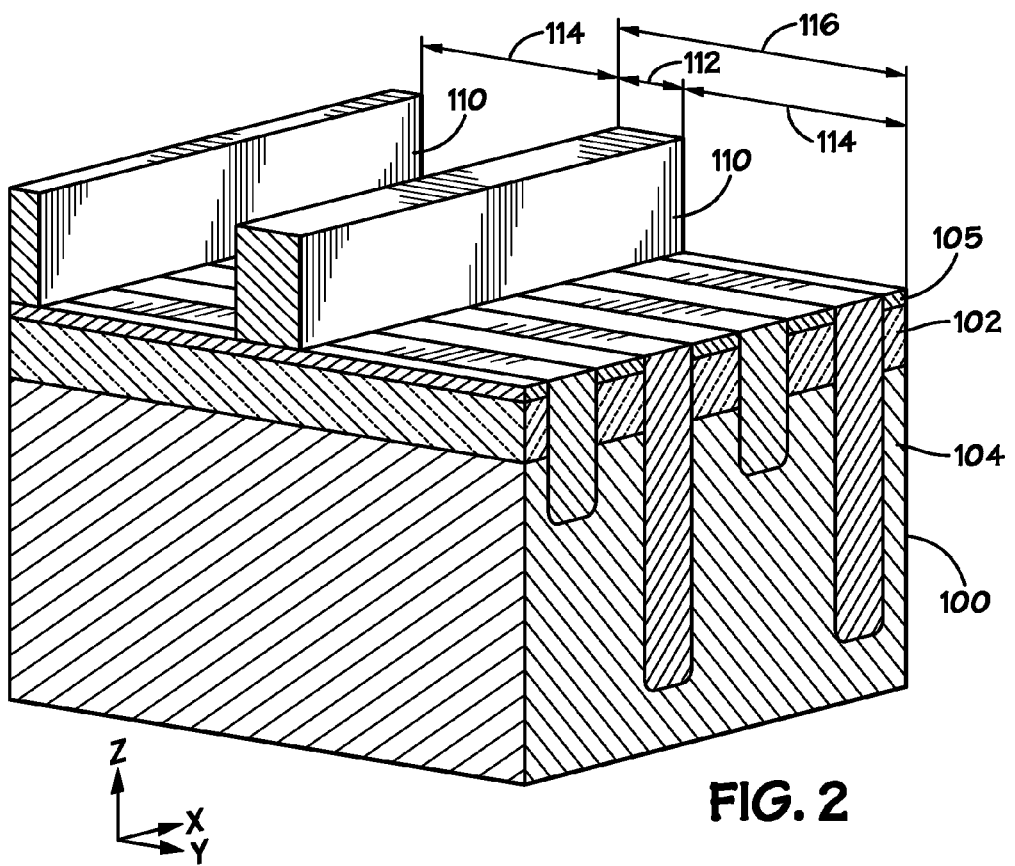
FIG. 2 depicts a mask formed during the manufacturing process in accordance with an embodiment of the present invention.

Turning now to FIG. 2, the manufacturing process may include a row mask 110. The row mask 110 may be formed with photoresist or it may be a hard mask, for example, and it may be patterned with photolithography or other lithographic processes, e.g., nano-imprint lithography or electron-beam lithography. For example, the mask 110 may be formed by patterning a body of amorphous carbon that is formed on the substrate 100. The mask 110 may define masked regions having a width 112 and exposed regions having a width 114. In some embodiments, the row 110 may be formed with a sub-photolithographic process, e.g., a sidewall-spacer process, a resist-reflow process, or a line-width thinning process. The widths 112 or 114 may be generally equal to or less than F, ¾ F, or ½ F. The row mask 110 may define a repeating pattern of lines with a pitch 116, or in some embodiments, the pattern may be interrupted by other structures. The masked regions of the row mask 110 may be generally straight, generally parallel to one another, and may generally extend in the x-direction. In other embodiments, the masked regions of the row mask 110 may undulate side to side or up and down, or they may be segmented.

Figure 3:
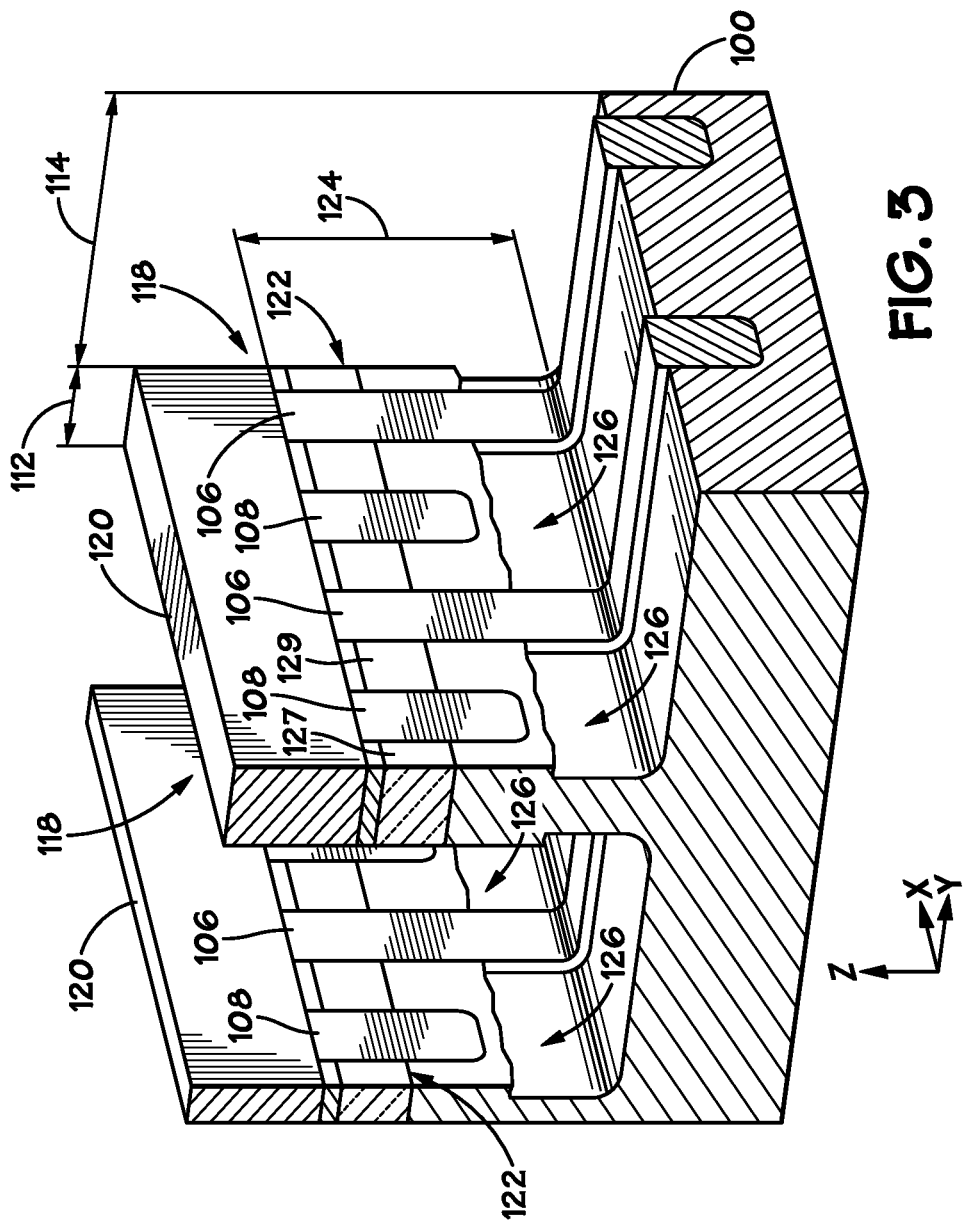
FIG. 3 depicts row trenches and fins formed during the manufacturing process in accordance with an embodiment of the present invention.

Next, as shown in FIG. 3, row trenches 118, formed from the exposed regions between the row masks 110, and fins 120 may be formed in accordance with an embodiment of the present invention. As described above, the row trenches 118 may be masked with photoresist and/or by forming a hard mask on the substrate 100. Various sub-photolithographic techniques may be used to pattern the trenches 118, such as reflowing patterned photoresist and/or forming sidewall spacers on a hard mask, for example. Once a mask is formed, the 118 may be etched from the substrate 100 with, for example, by any suitable poly etch, such as an anisotropic etch.

The row trenches 118 may extend in the x-direction, generally perpendicular to the deep isolation trenches 106 and shallow trenches 108. In the present embodiment, the row trenches 118 intersect a plurality of the deep isolation trenches 106 and shallow trenches 108. The row trenches 118 may be generally parallel to each other and of generally uniform depth and width. In some embodiments, the width 114 of the row trenches 118 is approximately F/2, where F is the wavelength of light used to pattern the row trenches 118. However, in other embodiments, the width 114 may be less than F/2 or greater than F/2. The row trenches 118 may have a pitch of approximately 4F, greater than 4F, or less than 4F. In a cross-section normal to the x-direction the row trenches 118 may be generally rectangular or trapezoidal. Alternatively, the row trenches 118 may have a cross-section with some other shape. In some embodiments, the cross-section is generally constant through some distance in the x-direction. The row trenches 118 may be deeper than the shallow trenches 106. In the present embodiment, the sidewalls of the row trenches 118 form walls 122, which, as is subsequently discussed, may each form a first wall or side of a fin 120 having a fin height 124.

Figure 6:
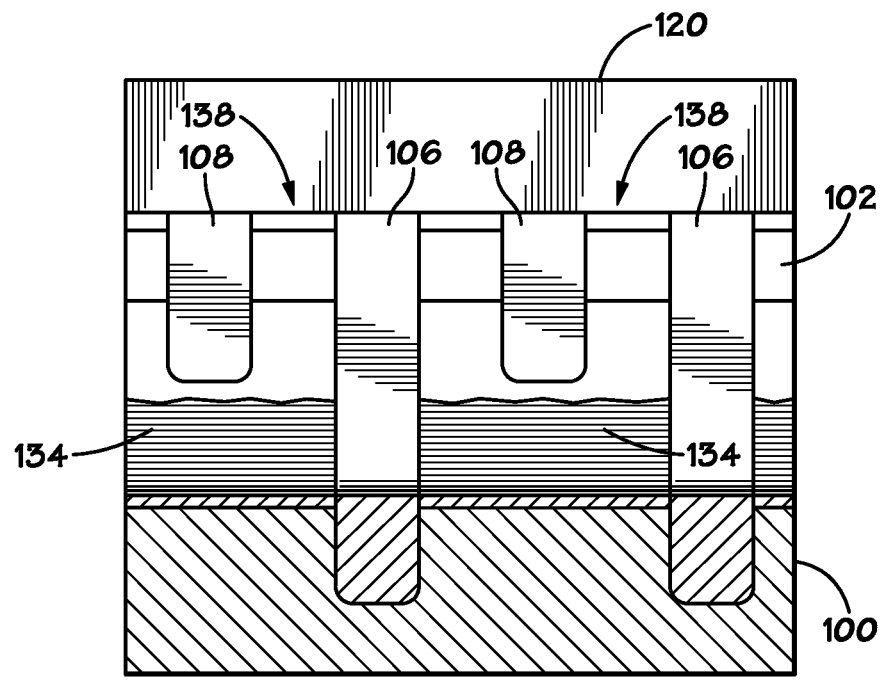
FIG. 6 is a side view of formation of isolating regions of the fin in accordance with an embodiment of the present invention.

As shown in FIG. 3, during etch of the row trenches 118, the portion of the substrate 100 underneath the shallow trenches 108 may also be etched in the x-, y-, and z-directions, forming hollow regions 126 between the shallow trenches 108 and the substrate 100 in the x-, y-, and z-directions. The hollow regions 126 may be any shape (e.g., irregular shape as shown in FIG. 6) and size and the hollow regions 126 may extend between deep isolation trenches (such as in the x direction) and may extend into the substrate 100 (such as in the z-direction into the p-doped substrate). It should be appreciated that the gate oxide forming the shallow wall trenches 108 and the deep isolation trenches 106 remains resistant to the etch or other formation of the hollow regions. The hollow regions 126 generally isolate a source 127 and drain 129 of a transistor formed by the shallow trenches 108 from the channel formed by the lower doped portion 104 (e.g., p-well) of the substrate 100.

Figure 4:
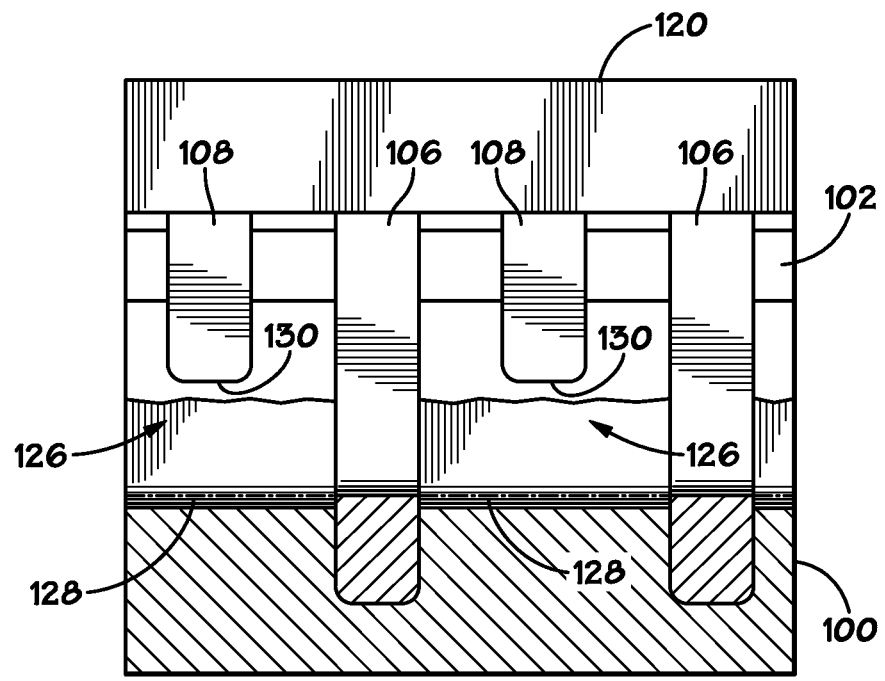
FIG. 4 is a side view of a fin of FIG. 3 in accordance with an embodiment of the present invention.

FIG. 4 is a side view of a fin 120 of FIG. 3 in accordance with an embodiment of the present invention. As shown in FIG. 4, the hollow regions 126 are formed (e.g., etched) underneath the shallow trenches 108, isolating the source 127 and drain 129 of a transistor. In some embodiments, etching of the row trenches 118 and the hollow regions 126 may extend below the fins 120 and into the substrate 100, as shown by regions 128. The etching of the hollow regions 126 may result in a portion 128 being etched at any depth in the substrate 100. However, to maintain separate (e.g., isolated) transistors of the fin 120, the portion 128 should not extend below the deep isolation trenches 106. Further, the hollow regions 126 should not extend above the bottom 130 of the shallow trenches 108 to maintain a transistor channel.

Figure 5:
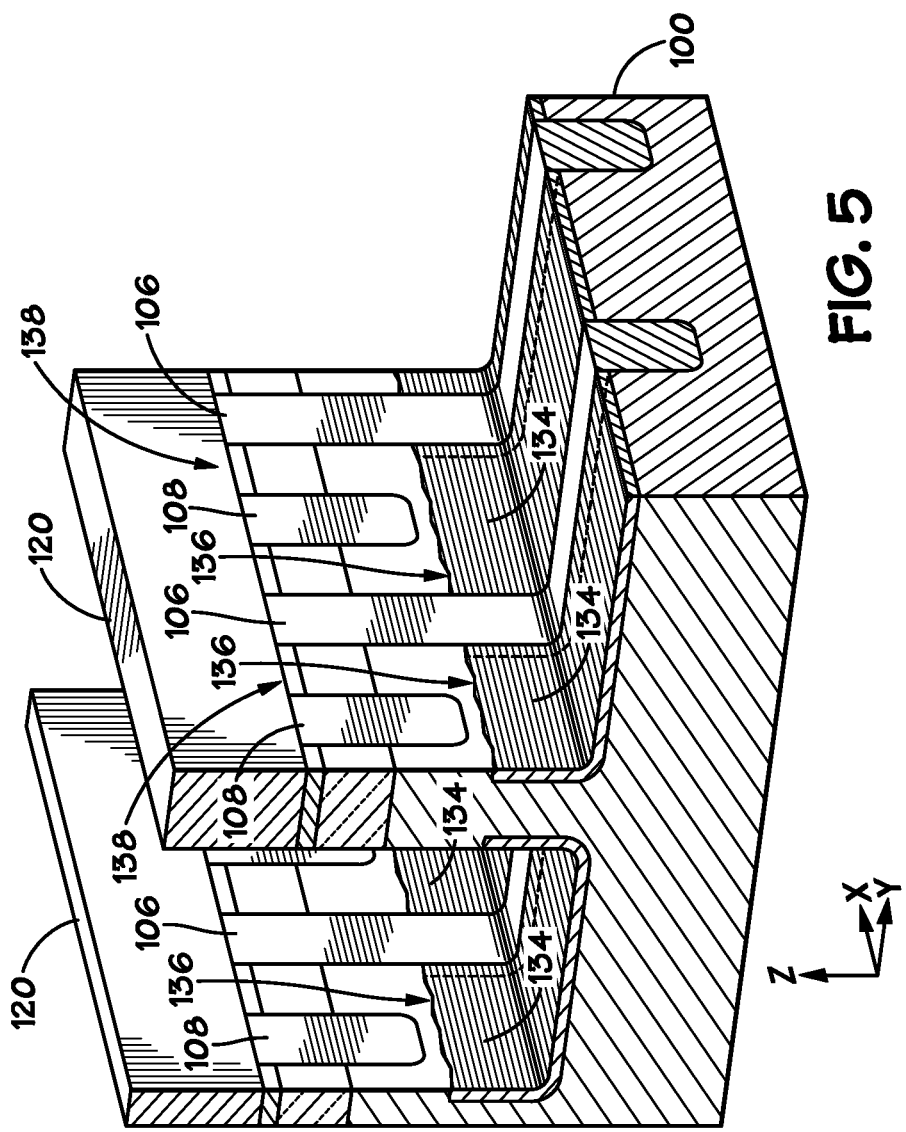
FIG. 5 depicts formation of an oxide in the hollow regions of the fin in accordance with an embodiment of the present invention.

After formation of the hollow regions 126, the hollow regions 126 may be filled with any suitable material. For example, as shown in FIG. 5, the hollow regions may be filled with a gate oxide 134 to form an isolating region 136. The gate oxide 134 may be grown on the substrate 100 and may be grown or deposited in the row trenches 118. In one embodiment the gate oxide 118 may include a high-density plasma (HDP) oxide layer and/or a thermal oxide. The structure 138 formed by the source 127, drain 129, and the isolating region 136 may be referred to as a floating body cell, e.g., the source 127 and drain 129 are "floating" above a channel formed in lower doped region 104 of substrate 100.

FIG. 6 is a side view of the floating body cells 138 on the fin 120 in accordance with an embodiment of the present invention. After growth or deposition of the gate oxide 134 and formation of the isolating region 136, the source 127 of each transistor may be isolated from the drain 129 of each transistor, constructing the floating body cell 134. In some embodiments, the floating body cell 134 may be referred to as being constructed on a silicon-on-insulator (SOI). For example, the floating body cell 134 is constructed on an insulator (e.g., the gate oxide 134 or suitable material) disposed on silicon (e.g., the substrate 100).

As shown in FIG. 7, after deposition of the gate oxide 134 and formation of isolating regions 136, independently biased gates 140 and 142 may be formed adjacent to each side of the fins 120 in accordance with an embodiment of the present invention. The gates 140 and 142 may be formed by blanket depositing a conductive material, such as titanium nitride, doped polysilicon, or other conductive material, and spacer etching the material to form the gates 140 and 142. The gates 140 and 142 may be disposed next to the walls 122 of the fin 120 and extend generally parallel to the fin 120, in the x-direction. The gates 140 and 142 may extend along any substantial portion of the fin 120 in the x-direction.

In certain embodiments, the fins 120 may form a portion of rows 144 and 146 of floating body cells. Each row 144 and 146 may include a plurality of generally identical floating body cells disposed at generally equidistant areas along the x-direction. Of course, in other embodiments, the floating body cells in rows 144 and 146 may not be generally identical, e.g., n-type and p-type transistors or differently sized transistors, and/or the floating body cells may not be regularly spaced along the rows 144 and 146.

As shown in FIG. 7, the gates 140 and 142 may be independently biased to affect the floating body cells adjacent to each side of the fin 120. In another embodiment, gates may be disposed on either side of the fins 120 and connected around the ends of each fin 120. FIG. 8 depicts a partial cross-section illustrating electrically coupled gates 148 and 150 extending around the end of the fin 120 forming a single structure in accordance with another embodiment of the invention. The gates 148 and 158 may be disposed adjacent to each wall of the fin 120. In such an embodiment, the gates 148 and 150 on either side of the fin 120 may be dependently biased, e.g., they are electrically connected and biased together. As shown in FIG. 8, the gates 148 and 150 may form a continuous structure around an end 152 of the fin 120.

Figure 9:
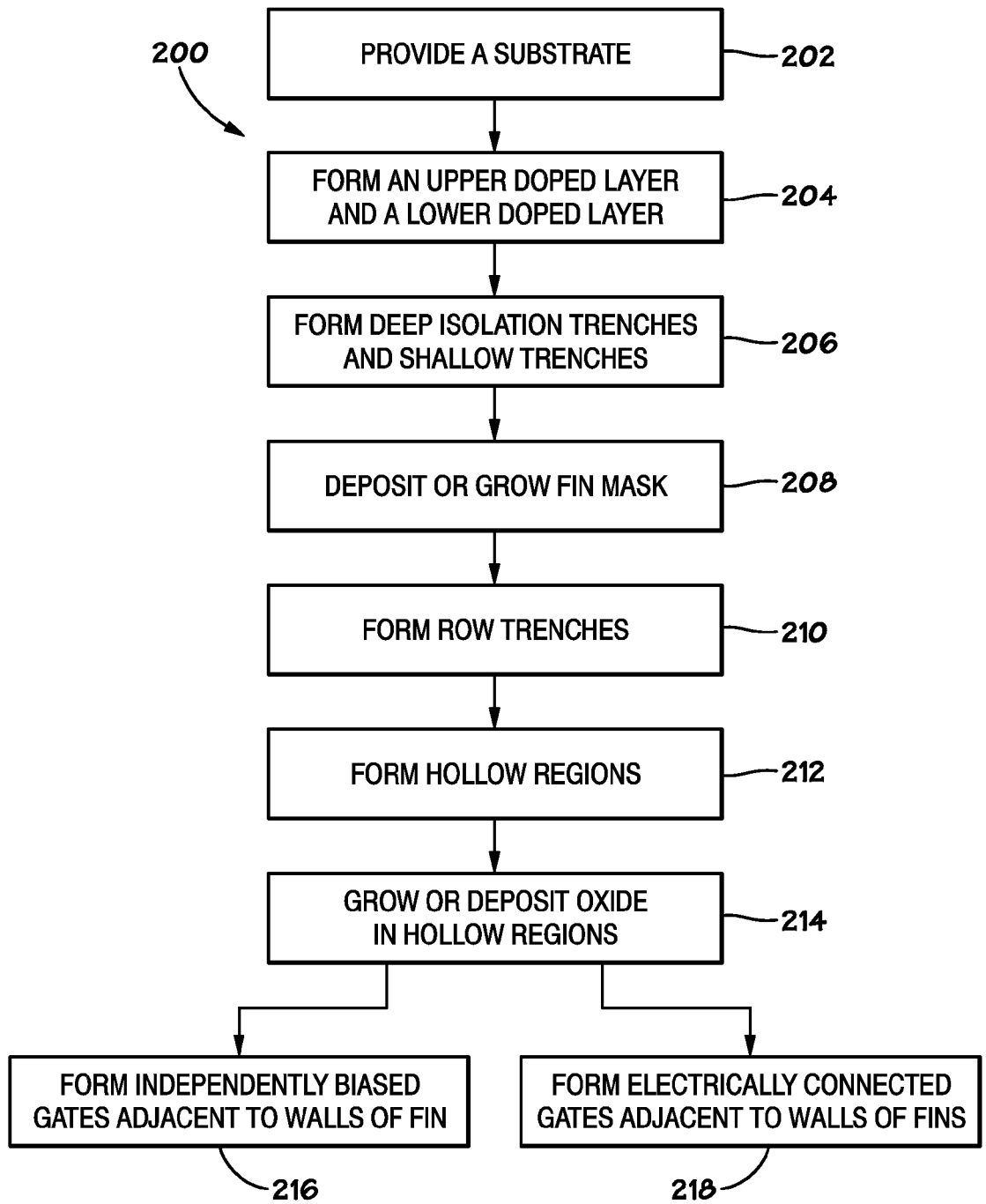
FIG. 9 is a flowchart of a manufacturing process in accordance with an embodiment of the present invention.

FIG. 9 depicts one embodiment of a manufacturing process 200 that may be used to manufacture a finFET or other high aspect ratio structures having floating body cells. With reference to FIG. 9, the manufacturing process 200 may begin with providing a substrate 100, as depicted by block 202. The substrate 100 may include any of the materials discussed in reference to the substrate 100 in FIG. 1. Additionally, the substrate 100 may include formation of the upper doped region 102 and a lower doped region 104, as depicted by block 204 in FIG. 12. It should be noted that the step depicted by block 204, like many of the steps in the manufacturing process 200, may be performed in a different sequence than that depicted by FIG. 9.

Deep isolation trenches 106 and shallow trenches 108 may be formed in the substrate 100, as depicted by block 206 in FIG. 9. The manufacturing process 200 may include depositing or growing a fin mask, as depicted by block 208 in FIG. 9. Next in the manufacturing process 200, row trenches 118 may be formed, as depicted by block 210 in FIG. 9, by any suitable process, such as anisotropic etch. As described above and shown in block 212, during the formation of row trenches 118, the hollow regions 126 may be formed underneath the shallow trenches 108 and between the deep isolation trenches 106.

After formation of the hollow regions, the manufacturing process 200 may include growing or depositing the gate oxide 134 in the hollow regions 126, as shown in block 214. As described above, the gate oxide 134 may include a high-density plasma (HDP) oxide layer and/or a thermal oxide. In one embodiment of the manufacturing process 200, independently biased gates 140 and 142 may be formed on the walls of the fins 120, as depicted by block 212 in FIG. 9. In other embodiments, electrically connected gates 148 and 150 (e.g., dependently biased active gates) may be formed on the walls of the fins 120, as depicted by block 218.

What is claimed is:

1. A method, comprising:
   providing a substrate having a first plurality of trenches and a second plurality of trenches;
   etching the substrate to form a fin, wherein the fin comprises the first plurality of trenches and the second plurality of trenches, and wherein etching the substrate comprises etching a region underneath the first plurality of trenches to electrically isolate a first upper doped region and a second upper doped region disposed on each side of each of the first plurality of trenches; and
   forming an oxide in the region to form a floating body cell from the first highly doped region and a second highly doped region of each of the first plurality of trenches.

2. The method of claim 1, wherein etching the substrate comprises etching the mask via anisotropic etch.

3. The method of claim 1, wherein forming an oxide in the region comprises growing or depositing a thermal oxide.

4. The method of claim 1, wherein forming an oxide in the region comprises growing or depositing a high density plasma oxide.

5. The method of claim 1, comprising forming a mask to define the fin, before etching the substrate.

6. The method of claim 1, comprising forming a gate on each side of the fin, wherein the gate on each side of the fin is electrically isolated from one another.

7. The method of claim 1, comprising forming a gate on each side of the fin, wherein the gate on each side of the fin is electrically connected to one another.

8. A method, comprising:
   forming an oxide underneath a trench in a fin to electrically isolate a channel of a transistor from a substrate;
   forming a first gate on a first wall of the fin; and
   forming a second gate on a second wall of the fin.

9. The method of claim 8, wherein the first gate is configured to be independently biased from the second gate.

10. The method of claim 8, wherein the second gate is configured to be biased dependent on the first gate.

11. The method of claim 8, wherein forming an oxide comprises growing or depositing a thermal oxide, high density plasma oxide, or a combination thereof.

12. The method of claim 8, wherein forming the oxide comprises forming a hollow region underneath the trench in the fin and forming a gate oxide in the etched region.

13. A method comprising:
    forming an oxide underneath a trench in a fin to isolate a source and a drain of a transistor to create a floating body cell;
    forming a first gate on a first wall of the fin; and
    forming a second gate on a second wall of the fin.

14. The method of claim 13, wherein the first gate is electrically coupled to the second gate.

15. A method, comprising:
    forming a fin in a substrate; and
    forming a floating body cell in the fin, wherein the floating body cell comprises a source and a drain separated by a dielectric portion formed in a trench in the fin, and wherein forming the floating body cell comprises forming an isolation region beneath the trench to isolate the source and drain.

16. The method of claim 15, comprising forming a first gate on a first wall of the fin.

17. The method of claim 16, comprising forming a second gate on a second wall of the fin, wherein the second gate is configured to be independently biased from the first gate.

18. The method of claim 16, comprising forming a second gate on a second wall of the fin, wherein the second gate is electrically coupled to the first gate.

19. The method of claim 15, wherein forming the isolation region comprises depositing or growing a thermal oxide, a high density plasma oxide, or a combination thereof.

20. The method of claim 15, wherein forming the isolation region comprises forming a hollow region that extends through the fin width and a portion of the fin height.

* * * * *